US012618912B2

(12) United States Patent
Choi et al.

(10) Patent No.: US 12,618,912 B2
(45) Date of Patent: May 5, 2026

(54) APPARATUS AND METHOD FOR DIAGNOSING BATTERY

(71) Applicant: LG ENERGY SOLUTION, LTD., Seoul (KR)

(72) Inventors: Soon-Hyung Choi, Daejeon (KR); Dong-Hyun Kim, Daejeon (KR); Young-Deok Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 19/036,867

(22) Filed: Jan. 24, 2025

(65) Prior Publication Data

US 2025/0244395 A1    Jul. 31, 2025

(30) Foreign Application Priority Data

Jan. 26, 2024    (KR) ......................... 10-2024-0012286

(51) Int. Cl.
*G01R 31/3842* (2019.01)
*B60L 58/16* (2019.01)
(Continued)

(52) U.S. Cl.
CPC .......... *G01R 31/3842* (2019.01); *B60L 58/16* (2019.02); *G07C 5/0808* (2013.01); *H01M 10/4285* (2013.01); *H01M 2220/20* (2013.01)

(58) Field of Classification Search
CPC ... G01R 31/3842; B60L 58/16; G07C 5/0808; H01M 10/4285; H01M 2220/20
See application file for complete search history.

(56) References Cited

U.S. PATENT DOCUMENTS 9,902,277 B2 *   2/2018   Keller ..................... H02J 7/977
11,703,548 B2 *   7/2023   Yezerets .............. G01R 31/385
                                                      324/426
(Continued)

FOREIGN PATENT DOCUMENTS

JP           5832380 B2    12/2015
JP           6123844 B2    5/2017
(Continued)

OTHER PUBLICATIONS

Fly, A. et al., 'Rate dependency of incremental capacity analysis (dQ/dV) as a diagnostic tool for lithium-ion batteries', Journal of Energy Storage, Jun. 2020, vol. 29, pp. 1-13.

*Primary Examiner* — Tung S Lau

(74) *Attorney, Agent, or Firm* — Bryan Cave Leighton Paisner LLP

(57)    ABSTRACT

A battery diagnosing apparatus according to an embodiment of the present disclosure includes: a profile acquisition unit that acquires a differential profile representing a correspondence between a voltage and a differential capacity of a battery; a profile correction unit that determines a target C-rate corresponding to the differential profile, and corrects the differential profile based on an overvoltage profile corresponding to the target C-rate, thereby generating a corrected profile; and a control unit that determines a first target peak and a second target peak in the corrected profile, and diagnoses a state of the battery based on a behavior of the first target peak and a behavior of the second target peak.

11 Claims, 10 Drawing Sheets

(51) Int. Cl.
    *G07C 5/08*               (2006.01)
    *H01M 10/42*           (2006.01)

(56)              References Cited

U.S. PATENT DOCUMENTS

| | | | |
|---|---|---|---|
| 2011/0313613 A1* | 12/2011 | Kawahara | H01M 10/441 |
| | | | 320/134 |
| 2015/0340885 A1 | 11/2015 | Baek et al. | |
| 2016/0061908 A1 | 3/2016 | Torai | |
| 2018/0038917 A1* | 2/2018 | Fukuda | G01B 7/24 |
| 2021/0046844 A1 | 2/2021 | Bae | |
| 2021/0190878 A1 | 6/2021 | Lee | |
| 2022/0082630 A1* | 3/2022 | Takaoka | G01R 31/3842 |
| 2022/0276314 A1* | 9/2022 | Kim | H01M 10/425 |
| 2023/0039356 A1 | 2/2023 | Jee et al. | |
| 2023/0140094 A1 | 5/2023 | Cha | |
| 2023/0176128 A1 | 6/2023 | Bae | |
| 2023/0194620 A1 | 6/2023 | Hyun-Jun | |
| 2023/0314515 A1* | 10/2023 | Bae | G01R 31/392 |
| | | | 702/63 |

FOREIGN PATENT DOCUMENTS

| | | | | | |
|---|---|---|---|---|---|
| JP | 2021197237 | A | 12/2021 | | |
| JP | 2021197832 | A | 12/2021 | | |
| JP | 2023519692 | A | 5/2023 | | |
| KR | 10-2015-0133587 | A | 11/2015 | | |
| KR | 1020210141096 | A | 11/2021 | | |
| KR | 10-2022-0009918 | A | 1/2022 | | |
| KR | 102349300 | B1 | 1/2022 | | |
| KR | 102351637 | B1 | 1/2022 | | |
| KR | 1020220067328 | A | 5/2022 | | |
| KR | 10-2022-0080620 | A | 6/2022 | | |
| KR | 10-2023-0120766 | A | 8/2023 | | |
| WO | WO 2021049882 | A1 * | 3/2021 | | G01R 31/382 |

* cited by examiner

FIG. 7

| CYCLE | POSITIVE ELECTRODE DEGRADATION RATE (%) | AVAILABLE LITHIUM DEGRADATION RATE (%) | NEGATIVE ELECTRODE DEGRADATION RATE (%) |
|---|---|---|---|
| INITIAL CYCLE(ini) | 0.0 | 0.0 | 0.0 |
| 10th CYCLE | 0.7 | 0.3 | 0.7 |
| 20th CYCLE | 1.0 | 0.1 | 0.7 |
| 30th CYCLE | 1.5 | 0.1 | 1.3 |
| 40th CYCLE | 1.9 | 0.2 | 1.3 |
| 50th CYCLE | 2.1 | 0.0 | 0.5 |
| 60th CYCLE | 2.5 | 0.1 | 1.4 |
| 70th CYCLE | 2.8 | 0.0 | 0.3 |
| 80th CYCLE | 3.1 | 0.0 | 1.3 |
| 90th CYCLE | 3.5 | 0.2 | 0.5 |

APPARATUS AND METHOD FOR DIAGNOSING BATTERY

CROSS-REFERENCE TO RELATED APPLICATION

This application claims the benefit of KR Patent Application No. 10-2024-0012286 filed on Jan. 26, 2024, the contents of which are all hereby incorporated by reference herein in their entirety.

TECHNICAL FIELD

The present disclosure relates to a battery diagnosing apparatus and method, more particularly, an apparatus and method for diagnosing the state of a battery.

BACKGROUND

Recently, with the rapidly increasing demand for portable electronic products such as notebook computers, video cameras, and portable telephones, and the accelerating development of electric vehicles, energy storage batteries, robots, and satellites, researches on the high-performance batteries allowing repeated charging and discharging are actively underway.

Currently, commercially available batteries include, for example, nickel-cadmium batteries, nickel-hydrogen batteries, nickel-zinc batteries, and lithium batteries. Of these batteries, lithium batteries are gaining considerable attention due to their advantages including a substantially low memory effect to allow a high degree of freedom in charging and discharging, a very low self-discharging rate, and high energy density, as compared to nickel-based batteries.

While many studies are being conducted on the batteries focusing on the high-capacity and the high-density, it is also important to improve the lifespan and the safety of the batteries. In order to enhance the safety of batteries, a technology is necessary, which may accurately diagnose the current state of batteries.

SUMMARY

An embodiment of the present disclosure provides a battery diagnosing apparatus and method, which may diagnose the current state of a battery relatively quickly.

Various aspects of the present disclosure may be understood from the descriptions herein below, and may be more clearly understood from embodiments of the present disclosure. Further, it is readily apparent that various aspects of the present disclosure may be implemented by elements described in the claims and combinations thereof.

A battery diagnosing apparatus according to an aspect of the present disclosure may include: a profile acquisition unit that acquires a differential profile representing a correspondence between a voltage and a differential capacity of a battery: a profile correction unit that determines a target C-rate corresponding to the differential profile, and corrects the differential profile based on an overvoltage profile corresponding to the target C-rate, thereby generating a corrected profile; and a control unit that determines a first target peak and a second target peak in the corrected profile, and diagnoses a state of the battery based on a behavior of the first target peak and a behavior of the second target peak.

The control unit may be configured to determine, as the first target peak, a minimum point with a smallest corresponding voltage in a voltage range including medium and higher voltages of the battery among minimum points included in the corrected profile.

The control unit may be configured to determine, as the second target peak, a maximum point with a largest corresponding voltage among maximum points included in the corrected profile.

The control unit may be configured to diagnose that the state of the battery is a positive electrode capacity loss state, when a voltage corresponding to the first target peak increases as a charging and discharging cycle of the battery progresses, and a differential capacity corresponding to the second target peak decreases as the charging and discharging cycle of the battery progresses.

The profile correction unit may be configured to calculate a difference between the differential profile and the overvoltage profile to generate the corrected profile.

The overvoltage profile may be pre-stored for each of a plurality of C-rates.

The profile correction unit may be configured to select the overvoltage profile corresponding to the target C-rate from a plurality of pre-stored overvoltage profiles.

The overvoltage profile may be preset based on a reference differential profile of a reference battery for a reference C-rate and a target differential profile of the reference battery for the target C-rate.

The overvoltage profile may be preset to represent a difference between the reference differential profile and the target differential profile.

A battery pack according to another aspect of the present disclosure may include the battery diagnosing apparatus according to an aspect of the present disclosure.

A vehicle according to yet another aspect of the present disclosure may include the battery diagnosing apparatus according to an aspect of the present disclosure.

A battery diagnosing method according to still yet another aspect of the present disclosure may include: a profile acquisition step of acquiring a differential profile representing a correspondence between a voltage and a differential capacity of a battery: a target determination step of determining a target C-rate corresponding to the differential profile: a corrected profile generation step of correcting the differential profile based on an overvoltage profile corresponding to the target C-rate to generate a corrected profile: a target peak determination step of determining a first target peak and a second target peak in the corrected profile; and a battery diagnosis step of diagnosing a state of the battery based on a behavior of the first target peak and a behavior of the second target peak.

A non-transitory computer-readable storage medium according to still yet another aspect of the present disclosure may store therein a program for performing a battery diagnosing method including: a profile acquisition step of acquiring a differential profile representing a correspondence between a voltage and a differential capacity of a battery: a target determination step of determining a target C-rate corresponding to the differential profile: a corrected profile generation step of correcting the differential profile based on an overvoltage profile corresponding to the target C-rate to generate a corrected profile: a target peak determination step of determining a first target peak and a second target peak in the corrected profile; and a battery diagnosis step of diagnosing a state of the battery based on a behavior of the first target peak and a behavior of the second target peak.

According to an aspect of the present disclosure, the state of a battery is diagnosed from a corrected profile, so that the state of the battery may be diagnosed relatively quickly.

According to an aspect of the present disclosure, it is diagnosed relatively quickly whether the state of the battery is a positive electrode capacity loss state, so that a diagnosis result for the current state of the battery may be provided relatively quickly.

The effects of the present disclosure are not limited to those described above, and other effects that are not described herein may clearly be understood to those skilled in the art from the descriptions in the claims.

BRIEF DESCRIPTION OF THE DRAWINGS

Since the drawings attached herewith serve to facilitate the understanding of the technical idea of the present disclosure in conjunction with the detailed description of the invention herein below, the present disclosure should not be construed as being limited to the matters illustrated in the drawings.

FIG. 7 is a view schematically illustrating the state of a battery corresponding to a plurality of corrected profiles according to an embodiment of the present disclosure.

DETAILED DESCRIPTION

Figure 1:
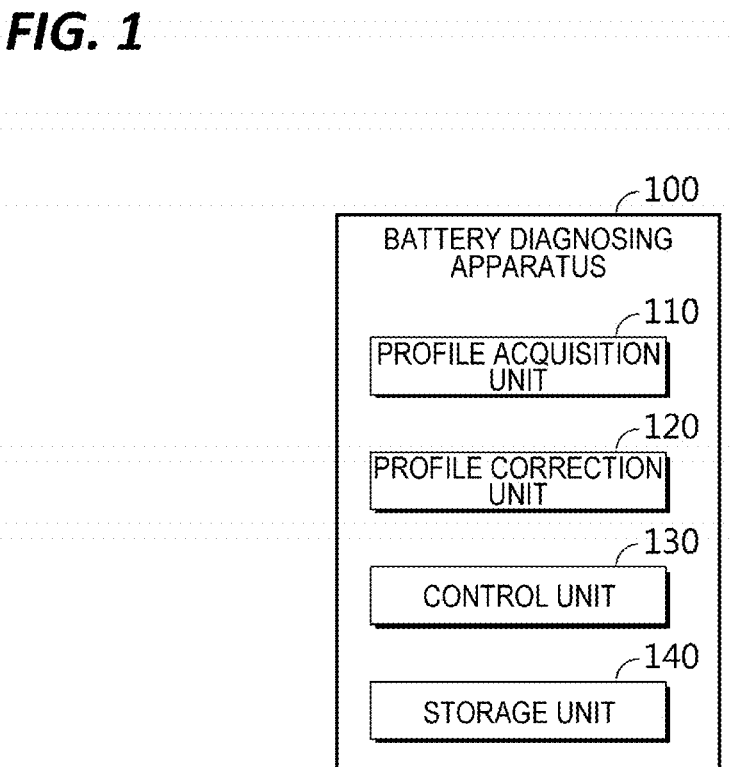
FIG. 1 is a view schematically illustrating a battery diagnosing apparatus according to an embodiment of the present disclosure.

Words and terms used in the detailed description and the claims herein should not be interpreted to be limited to their usual or dictionary meanings, but should be interpreted to have meanings and concepts that correspond to the technical idea of the present disclosure in compliance with the principle that inventors may appropriately define terms and concepts for the purpose of best describing the present disclosure.

Accordingly, it can be appreciated that the embodiments described herein and the configurations illustrated in the drawings are merely examples of the present disclosure, which do not exhaustively represent the technical idea of the present disclosure, and various equivalents and modifications may be made to substitute the present disclosure at the time of filing the present disclosure.

When describing the present disclosure, detailed description of related known configurations or functions may be omitted if determined to obscure the gist of the present disclosure.

Terms with ordinal numbers such as first, second and so on may be used to discriminate one of various components from the other, but should not be interpreted as limiting the components.

Throughout the descriptions herein, when a certain part "includes" a specific component, this description does not indicate that the certain part excludes other components, but indicates that the certain part may further include other components, unless otherwise defined.

Further, throughout the descriptions herein, when two components are "connected" to each other, this description indicates not only that the two components are "directly connected" to each other, but also that the two components are "indirectly connected" to each other via another component.

FIG. 1 is a view schematically illustrating a battery diagnosing apparatus 100 according to an embodiment of the present disclosure.

Referring to FIG. 1, the battery diagnosing apparatus 100 may include a profile acquisition unit 110, a profile correction unit 120, a control unit 130, and a storage unit 140.

A battery may indicate a single isolated cell that is physically separable and has a negative electrode terminal and a positive electrode terminal. For example, a lithium-ion battery or a lithium polymer battery may be considered as the battery. The type of battery may be a cylindrical type, a prismatic type, or a pouch type. Further, the battery may indicate a battery bank, a battery module, or a battery pack, in which a plurality of cells is connected to each other in series and/or in parallel. Hereinafter, for the convenience of description, descriptions will be made assuming that the battery indicates a single isolated cell.

The profile acquisition unit 110 may be configured to acquire a differential profile representing a correspondence between the voltage and the differential capacity of a battery.

For example, a battery profile BP is a profile representing a correspondence between the voltage (V) and the capacity (Q) when the battery is charged such that the state of charge (SOC) thereof reaches a preset charging termination SOC or 100% from a preset charging start SOC or 0%. In another example, the battery profile BP may represent a correspondence between the voltage (V) and the capacity (Q) when the battery is discharged such that the SOC thereof reaches a preset discharging termination SOC or 0% from a preset discharging start SOC or 100%.

Figure 2:
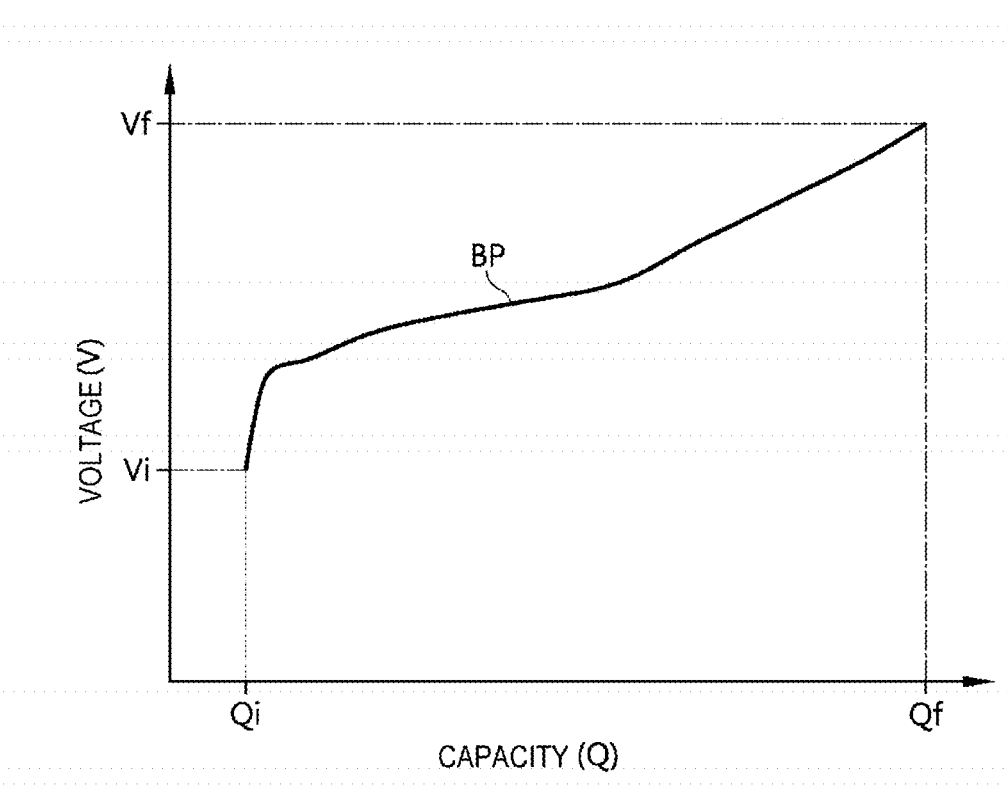
FIG. 2 is a view schematically illustrating a battery profile according to an embodiment of the present disclosure.

FIG. 2 is a view schematically illustrating the battery profile BP according to an embodiment of the present disclosure. In the embodiment of FIG. 2, the battery profile BP may be represented as an X-Y graph in which the X axis is set as the capacity (Q), and the Y axis is set as the voltage (V).

Then, when the battery profile BP is differentiated with respect to the voltage, a differential profile DP may be generated, which represents a correspondence between the differential capacity (dQ/dV) and the voltage (V).

Figure 3:
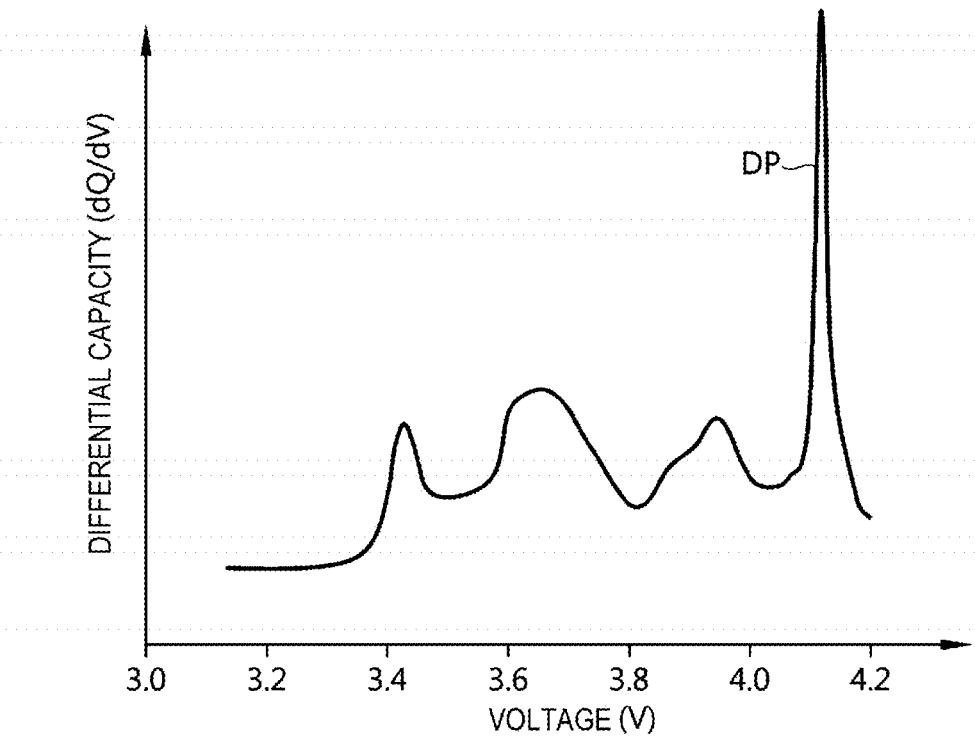
FIG. 3 is a view schematically illustrating a differential profile according to an embodiment of the present disclosure.

FIG. 3 is a view schematically illustrating the differential profile DP according to an embodiment of the present disclosure. In the embodiment of FIG. 3, the differential profile DP may be represented as an X-Y graph in which the X axis is set as the voltage (V), and the Y axis is set as the differential capacity (dQ/dV).

For example, the C-rate (current-rate) of the charging or discharging for generating the battery profile BP is not particularly limited. In order to acquire more accurate battery profile BP and differential profile DP according to an embodiment, the battery needs to be charged or discharged at a low rate. For example, the battery profile BP may be generated during the process of charging or discharging the battery at a relatively low rate such as 0.05 C.

According to an embodiment, the profile acquisition unit 110 may receive the differential profile DP of the battery directly from the outside. For example, the profile acquisition unit 110 may acquire the differential profile DP by being connected to the outside via a wired and/or wireless network to receive the differential profile DP.

In another example, the profile acquisition unit 110 may directly generate the differential profile DP by receiving the battery profile BP of the battery from the outside, and differentiating the received battery profile BP with respect to the voltage. For example, the profile acquisition unit 110 may be connected to the outside via a wired and/or wireless network to receive the battery profile BP, and directly generate the differential profile DP from the received battery profile BP, to acquire the differential profile DP.

In another example, the profile acquisition unit 110 may receive battery information about the voltage and the capacity of the battery from the outside, directly generate the battery profile BP based on the received battery information, and also directly generate the differential profile DP based on the generated battery profile BP.

According to an embodiment, the profile acquisition unit 110 may be connected to the control unit 130 for a communication. For example, the profile acquisition unit 110 may be connected to the control unit 130 in the wired or wireless manner. The profile acquisition unit 110 may transmit the acquired differential profile DP to the control unit 130.

According to an embodiment, the profile correction unit 120 may be configured to determine a target C-rate corresponding to the differential profile DP.

According to an embodiment, the profile correction unit 120 may acquire the differential profile DP and information about the corresponding target C-rate together.

For example, when the battery is charged at 0.33 C, the target C-rate corresponding to the differential profile DP may be 0.33 C. The profile correction unit 120 may receive the differential profile DP and information about 0.33 C from the profile acquisition unit 110. Then, the profile correction unit 120 may determine 0.33 C corresponding to the differential profile DP to be the target C-rate.

The profile correction unit 120 may be configured to correct the differential profile DP based on an overvoltage profile corresponding to the target C-rate, thereby generating a corrected profile CP.

According to an embodiment, the overvoltage profile may be preset to represent an overvoltage portion included in the differential profile DP. For example, the overvoltage profile may be preset based on a reference differential profile DP of a reference battery for a reference C-rate and a target differential profile DP of the reference battery for the target C-rate. According to an embodiment, the target C-rate may be set to be greater than the reference C-rate. Further, the overvoltage profile may be preset to represent a difference between the reference differential profile DP and the target differential profile DP.

For example, it is assumed that the reference C-rate is 0.05 C, and the target C-rate is 0.33 C. When the reference battery is charged (or discharged) at 0.05 C, a reference battery profile BP for the reference C-rate may be acquired, and the reference differential profile DP may be acquired based on the reference battery profile BP. When the reference battery is charged (or discharged) at 0.33 C, a target battery profile BP for the target C-rate may be acquired, and the target differential profile DP may be acquired based on the target battery profile BP. Then, an overvoltage profile corresponding to the C-rate of 0.33 C may be generated according to the difference between the reference differential profile DP and the target differential profile DP. When the battery is charged or discharged at the target C-rate greater than the reference C-rate, the measured voltage of the battery may include an overvoltage. Thus, the profile correction unit 120 may remove the reference differential profile DP based on the reference C-rate from the target differential profile DP based on the target C-rate, to generate the overvoltage profile.

Then, the profile correction unit 120 may be configured to select an overvoltage profile corresponding to the target C-rate from a plurality of pre-stored overvoltage profiles.

An overvoltage profile may be stored in advance for each of a plurality of C-rates.

For example, a plurality of overvoltage profiles may be provided, and C-rates corresponding to the plurality of overvoltage profiles, respectively, may be different from each other. For example, based on unit C-rates, overvoltage profiles corresponding to the C-rates, respectively, may be stored in advance.

Further, an overvoltage profile for a C-rate that is not acquired experimentally may be acquired and stored through an interpolation or extrapolation between similar overvoltage profiles. For example, the profile correction unit 120 may generate overvoltage profiles for various C-rates through the interpolation or extrapolation, in addition to the pre-stored overvoltage profiles, and store the generated overvoltage profiles in the storage unit 140. For example, when an overvoltage profile corresponding to the C-rate of 1 C and an overvoltage profile corresponding to the C-rate of 1.2 C are pre-stored, an overvoltage profile corresponding to the C-rate of 1.1 C may be further acquired based on the difference between the two overvoltage profiles.

The profile correction unit 120 may be configured to calculate the difference between the differential profile DP and the overvoltage profile to generate the corrected profile CP.

For example, the profile correction unit 120 may generate the corrected profile CP by calculating the difference between the differential profile DP and the overvoltage profile in the same way that the overvoltage profile is generated according to the difference between the reference differential profile DP and the target differential profile DP.

Alternatively, the profile correction unit 120 may generate the corrected profile CP by calculating a differential capacity difference for each voltage between the differential profile DP and the overvoltage profile.

Figure 4:
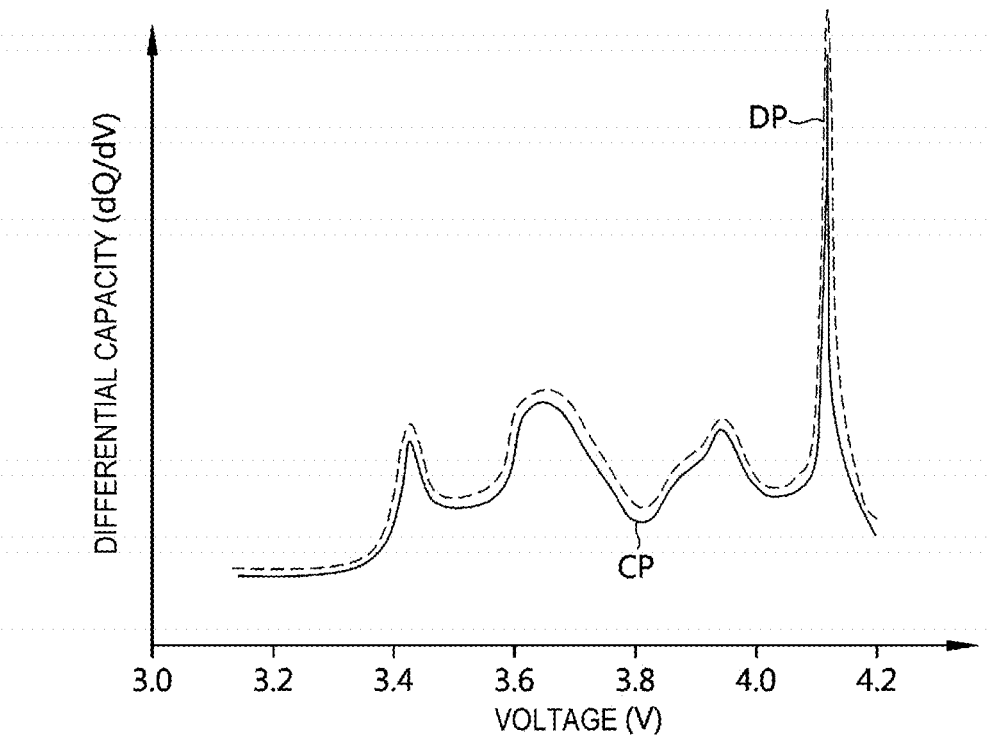
FIG. 4 is a view schematically illustrating a differential profile and a corrected profile according to an embodiment of the present disclosure.
Figure 5:
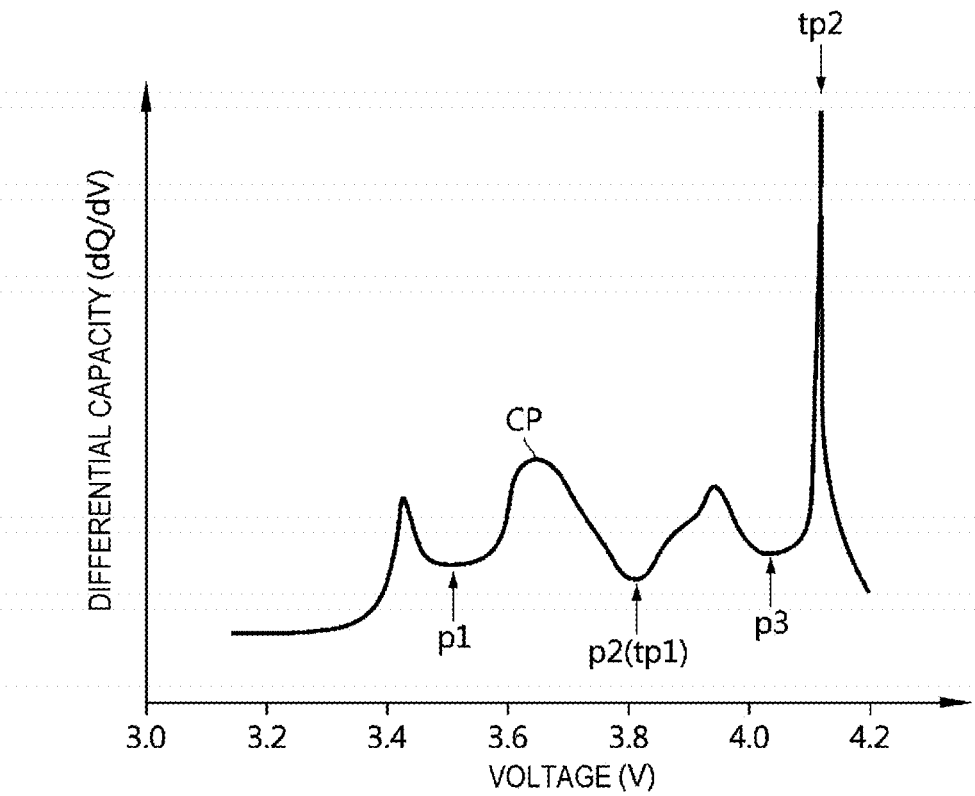
FIG. 5 is a view schematically illustrating a corrected profile according to an embodiment of the present disclosure.

FIG. 4 is a view schematically illustrating the differential profile DP and the corrected profile CP according to an embodiment of the present disclosure. FIG. 5 is a view schematically illustrating the corrected profile CP according to an embodiment of the present disclosure.

In the embodiment of FIG. 4, the corrected profile CP may be generated according to the differential capacity difference for each voltage between the differential profile DP and the corresponding overvoltage profile (not illustrated). For example, the profile correction unit 120 may calculate the difference between the differential profile DP and the overvoltage profile to generate the corrected profile CP in which the overvoltage portion included in the differential profile DP is removed.

Referring to FIG. 5, the control unit 130 may be configured to determine a first target peak tp1 and a second target peak tp2 in the corrected profile CP.

The control unit 130 may be configured to determine, as the first target peak tp1, a minimum point with the lowest corresponding voltage in the voltage range including the medium and higher voltages of the battery among minimum points included in the corrected profile CP.

The control unit 130 may determine one or more minimum points in the corrected profile by considering the variation rate of the differential capacity with respect to the voltage. For example, a minimum point refers to a point where the variation rate of the differential capacity with respect to the voltage is "0," and indicates the downward convex peak in the graph of the corrected profile CP in FIGS. 4 and 5. The corrected profile CP may include a plurality of minimum points. Among the plurality of minimum points, the control unit 130 may determine a minimum point with the lowest corresponding voltage in the voltage range including the medium and higher voltages to be the first target peak tp1.

For example, it is assumed that the voltage range of the battery is Vi [V] to Vf [V]. The medium voltage of the battery may be calculated according to the arithmetic formula "(Vf–Vi)/2." For example, the voltage range including the medium and higher voltages of the battery is the voltage range of "(Vf–Vi)/2" or more and Vf or less. The control unit 130 may determine the minimum point corresponding to the lowest voltage that is higher than the medium voltage of the battery ((Vf–Vi)/2), to be the first target peak tp1.

In the embodiment of FIG. 5, the corrected profile CP may include a first minimum point p1, a second minimum point p2, and a third minimum point p3. Since the medium voltage of the battery is about 3.6 [V], the voltage corresponding to the first minimum point p1 is the highest in the voltage range equal to or lower than the medium voltage of the battery. The voltage corresponding to the second minimum point p2 is the lowest in the voltage range equal to or higher than the medium voltage of the battery. The voltage corresponding to the third minimum point p3 is the highest in the voltage range equal to or higher than the medium voltage of the battery. Thus, the control unit 130 may determine the second minimum point p2 to be the first target peak tp1.

The control unit 130 may be configured to determine, as the second target peak tp2, a maximum point with the highest corresponding voltage among maximum points included in the corrected profile CP.

According to an embodiment, the control unit 130 may determine one or more maximum points in the corrected profile CP by considering the variation rate of the differential capacity with respect to the voltage. For example, a maximum point refers to a point where the variation rate of the differential capacity with respect to the voltage is "0," and indicates the upward convex peak in the graph of the corrected profile CP in FIG. 5. The corrected profile CP may include a plurality of maximum points. Among the plurality of maximum points, the control unit 130 may determine a maximum point with the highest corresponding voltage to be the second target peak tp2. In the embodiment of FIG. 5, the second target peak tp2 may be included in the voltage range of 4.0 [V] or more.

In the embodiment of FIG. 5, the corrected profile CP includes four maximum points appearing near about 3.4 [V], about 3.65 [V], about 3.95 [V], and about 4.1 [V]. Among the plurality of maximum points, the voltage corresponding to the maximum point near about 4.1 [V] is the highest, and therefore, the control unit 130 may determine the maximum point to be the second target peak tp2.

The control unit 130 may be configured to diagnose the state of the battery based on the behavior of the first target peak tp1 and the behavior of the second target peak tp2.

For example, the control unit 130 may diagnose whether the battery is suffering from a positive electrode capacity loss, based on the behaviors of the first target peak tp1 and the second target peak tp2. For example, the control unit 130 may diagnose whether the state of the battery is a positive electrode capacity loss state. The positive electrode capacity loss state refers to a state where the positive electrode of the battery is physically and/or chemically damaged, and thus, the positive electrode that may participate in the charging and discharging is lost. The positive electrode capacity loss state may indicate the degraded state of the battery with the positive electrode capacity loss.

First, the control unit 130 may determine a variation behavior of the first target peak tp1 over time. For example, the first target peak tp1 may be determined each time the charging and discharging cycle of the battery progresses, and the voltage and the differential capacity corresponding to the first target peak tp1 may be stored. By comparing a plurality of stored voltages and/or differential capacities of the first target peak tp1, the control unit 130 may determine the variation behavior of the first target peak tp1. For example, the control unit 130 may compare the voltages of the first target peak tp1 over time, to determine that the voltage of the first target peak tp1 has decreased, been constant, or has increased. Further, the control unit 130 may compare the differential capacities of the first target peak tp1 over time, to determine that the differential capacity of the first target peak tp1 has decreased, been constant, or has increased.

Further, the control unit 130 may determine a variation behavior of the second target peak tp2 over time. For example, the second target peak tp2 may be determined each time the charging and discharging cycle of the battery progresses, and the voltage and the differential capacity corresponding to the second target peak tp2 may be stored. By comparing a plurality of stored voltages and/or differential capacities of the second target peak tp2, the control unit 130 may determine the variation behavior of the second target peak tp2. For example, the control unit 130 may compare the voltages of the second target peak tp2 over time, to determine that the voltage of the second target peak tp2 has decreased, been constant, or has increased. Further, the control unit 130 may compare the differential capacities of the second target peak tp2 over time, to determine that the differential capacity of the second target peak tp2 has decreased, been constant, or has increased.

The control unit 130 may determine whether the voltage corresponding to the first target peak tp1 increases as the cycle progresses. Further, the control unit 130 may determine whether the differential capacity corresponding to the second target peak tp2 decreases as the cycle progresses. The control unit 130 may be configured to diagnose that the state of the battery is the positive electrode capacity loss state, when the voltage of the first target peak tp1 increases and the differential capacity of the second target peak tp2 decreases as the cycle progresses.

Figure 6:
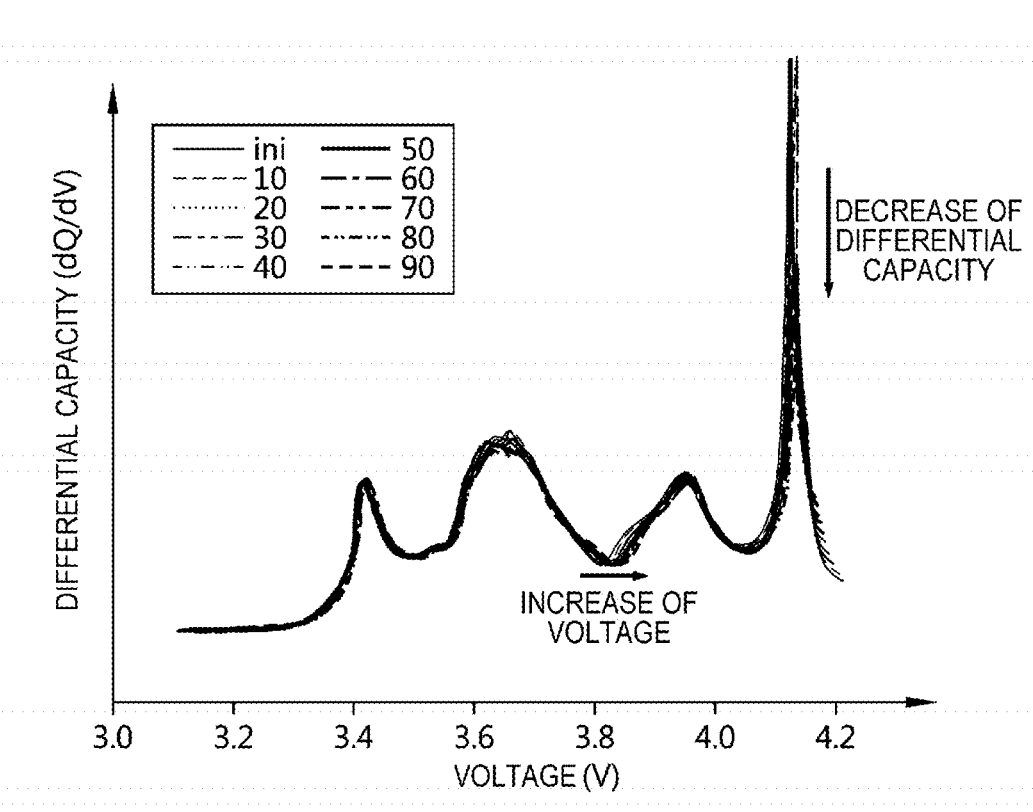
FIG. 6 is a view schematically illustrating a plurality of corrected profiles according to an embodiment of the present disclosure.

FIG. 6 is a view schematically illustrating a plurality of corrected profiles CP according to an embodiment of the present disclosure.

The embodiment of FIG. 6 includes corrected profiles CP that correspond to an initial cycle "ini," a 10th cycle, a 20th cycle, a 30th cycle, a 40th cycle, a 50th cycle, a 60th cycle, a 70th cycle, an 80th cycle, and a 90th cycle. The voltage of the first target peak tp1 in the plurality of corrected profiles CP increases as the cycle progresses. Further, the differential capacity of the second target peak tp2 in the plurality of corrected profiles CP decreases as the cycle progresses. Thus, the control unit 130 may diagnose that the state of the battery is the positive electrode capacity loss state.

FIG. 7 is a view schematically illustrating the state of the battery corresponding to the plurality of corrected profiles CP according to an embodiment of the present disclosure. The embodiment of FIG. 6 and the embodiment of FIG. 7 relate to the same battery. For example, FIG. 6 illustrates a plurality of corrected profiles CP for a diagnosis target battery, and FIG. 7 illustrates the state of the diagnosis target battery by cycles.

In the embodiment of FIG. 7, the positive electrode degradation rate refers to the loss rate of positive electrode capacity, and indicates the rate at which the positive electrode capacity has been degraded as compared to the initial state. For example, when 2% of the positive electrode capacity is unavailable as compared to the initial state, the positive electrode degradation rate is 2%.

An available lithium degradation rate refers to the loss rate of lithium used for the charging and discharging, and indicates the rate at which the available lithium has been degraded as compared to the initial state. For example, when 1% of the available lithium is unavailable as compared to the initial state, the available lithium degradation rate is 1%.

The negative electrode degradation rate refers to the loss rate of the negative electrode capacity, and indicates the rate at which the negative electrode capacity has been degraded as compared to the initial state. For example, when 1% of the negative electrode capacity is unavailable as compared to the initial state, the negative electrode degradation rate is 1%.

Each of the positive electrode degradation rate, the available lithium degradation rate, and the negative electrode degradation rate of the battery corresponding to the initial cycle "ini" is 0.0%. For the battery corresponding to the 10th cycle, the positive electrode degradation rate is 0.7%, the available lithium degradation rate is 0.3%, and the negative electrode degradation rate is 0.7%. For the battery corresponding to the 20th cycle, the positive electrode degradation rate is 1.0%, the available lithium degradation rate is 0.1%, and the negative electrode degradation rate is 0.7%. For the battery corresponding to the 30th cycle, the positive electrode degradation rate is 1.5%, the available lithium degradation rate is 0.1%, and the negative electrode degradation rate is 1.3%. For the battery corresponding to the 40th cycle, the positive electrode degradation rate is 1.9%, the available lithium degradation rate is 0.2%, and the negative electrode degradation rate is 1.3%. For the battery corresponding to the 50th cycle, the positive electrode degradation rate is 2.1%, the available lithium degradation rate is 0.0%, and the negative electrode degradation rate is 0.5%. For the battery corresponding to the 60th cycle, the positive electrode degradation rate is 2.5%, the available lithium degradation rate is 0.1%, and the negative electrode degradation rate is 1.4%. For the battery corresponding to the 70th cycle, the positive electrode degradation rate is 2.8%, the available lithium degradation rate is 0.0%, and the negative electrode degradation rate is 0.3%. For the battery corresponding to the 80th cycle, the positive electrode degradation rate is 3.1%, the available lithium degradation rate is 0.0%, and the negative electrode degradation rate is 1.3%. For the battery corresponding to the 90th cycle, the positive electrode degradation rate is 3.5%, the available lithium degradation rate is 0.2%, and the negative electrode degradation rate is 0.5%.

Referring to FIG. 7, as the charging and discharging cycle of the battery progresses, the positive electrode degradation rate of the battery increases gradually, but the available lithium degradation rate and the negative electrode degradation rate are not on the increasing trend. For example, the positive electrode capacity of the battery has been lost, but the available lithium and the negative electrode capacity thereof have not been lost. Meanwhile, referring to FIG. 6, as the cycle progresses, the voltage of the first target peak tp1 increases gradually, and the differential capacity of the second target peak tp2 decreases gradually. Therefore, the control unit 130 may diagnose whether the positive electrode capacity of the battery is lost, based on the behaviors of the first target peak tp1 and the second target peak tp2.

Meanwhile, the profile acquisition unit 110, the profile correction unit 120, and the control unit 130 provided in the battery diagnosing apparatus 100 may selectively include, for example, a processor, an application-specific integrated circuit (ASIC), other chipsets, logic circuits, registers, a communication modem, and a data processing apparatus, which are well-known in the art, in order to execute various control logics performed in the present disclosure. When the control logics are implemented by software, the profile correction unit 120 may be implemented as a set of program modules. In this case, the program modules may be stored in a memory, and executed by the profile acquisition unit 110, the profile correction unit 120, and the control unit 130. The memory may be provided inside or outside the profile acquisition unit 110, the profile correction unit 120, and the control unit 130, and may be connected to the profile acquisition unit 110, the profile correction unit 120, and the control unit 130 by various well-known means.

The battery diagnosing apparatus 100 may further include the storage unit 140. The storage unit 140 may store, for example, data or programs necessary when each component of the battery diagnosing apparatus 100 performs the operation and function thereof, or data generated when the operation and function are performed. The storage unit 140 is not particularly limited in type as long as it is a well-known information storage means capable of recording, erasing, updating, and reading data. The information storage means may include, for example, a random access memory (RAM), a flash memory, a read-only memory (ROM), an electronically erasable programmable read-only memory (EEPROM), and a register. Further, the storage unit 140 may store program codes, in which processes executable by the profile acquisition unit 110, the profile correction unit 120, and the control unit 130 are defined.

The storage unit 140 may store the battery profile BP, the differential profile DP, and the corrected profile CP.

The battery diagnosing apparatus 100 according to the present disclosure may be applied to a battery management system (BMS). For example, a BMS according to the present disclosure may include the battery diagnosing apparatus 100 described above. In this configuration, at least a portion of the respective components of the battery diagnosing apparatus 100 may be implemented by complementing or adding functions of components included in well-known BMSs. For example, the profile acquisition unit 110, the profile correction unit 120, the control unit 130, and the storage unit 140 of the battery diagnosing apparatus 100 may be implemented as components of the BMS.

Further, the battery diagnosing apparatus 100 according to the present disclosure may be provided in a battery pack. For example, the battery pack according to the present disclosure may include the battery diagnosing apparatus 100 described above and one or more battery cells. The battery pack may further include, for example, electrical components (e.g., relays and fuses) and a case.

Figure 8:
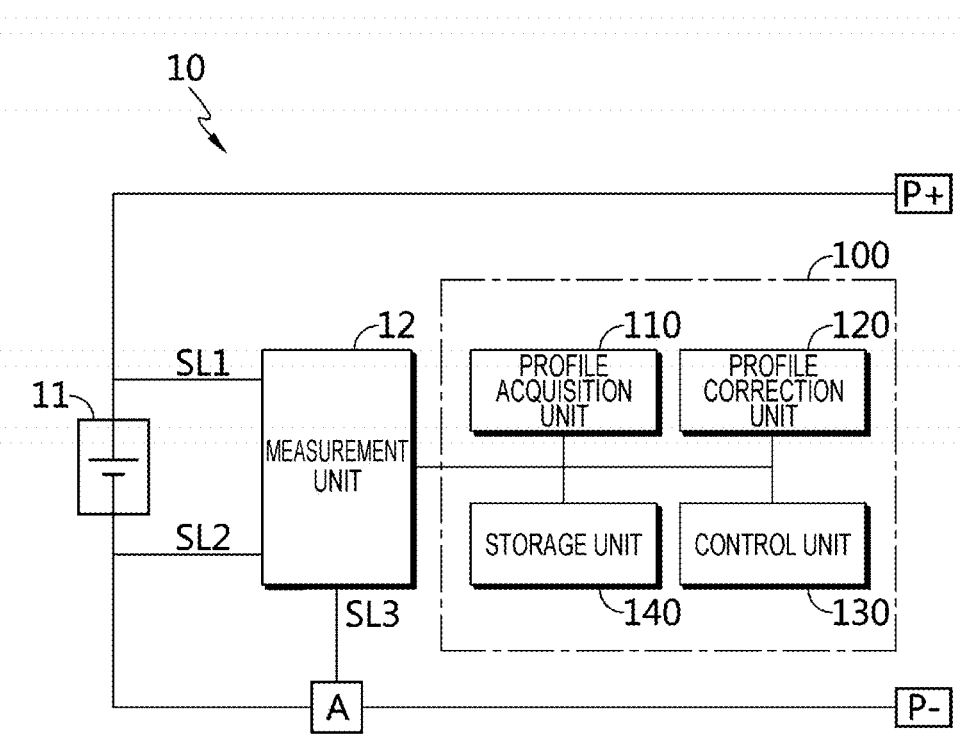
FIG. 8 is a view schematically illustrating a battery pack according to another embodiment of the present disclosure.

FIG. 8 is a view schematically illustrating a battery pack 10 according to another embodiment of the present disclosure.

The positive electrode terminal of the battery 11 may be connected to the positive electrode terminal P+ of the battery pack 10, and the negative electrode terminal of the battery 11 may be connected to the negative electrode terminal P− of the battery pack 10.

The measurement unit 12 may be connected to a first sensing line SL1, a second sensing line SL2, and a third sensing line SL3. The measurement unit 12 may be connected to the positive electrode terminal of the battery 11 via the first sensing line SL1, and may be connected to the negative electrode terminal of the battery 11 via the second sensing line SL2. The measurement unit 12 may measure the voltage of the battery 11 based on the voltage measured in each of the first sensing line SL1 and the second sensing line SL2.

The measurement unit 12 may be connected to a current measuring unit A via the third sensing line SL3. For example, the current measuring unit A may be an ammeter or a shunt resistor capable of measuring a charging current and a discharging current of the battery 11. The measurement unit 12 may measure the charging current of the battery 11 through the third sensing line SL3 to calculate a charging amount. Further, the measurement unit 12 may measure the discharging current of the battery 11 through the third sensing line SL3 to calculate a discharging amount.

For example, the profile acquisition unit 110 may receive the battery information about the voltage and the current of the battery from the measurement unit 12. Then, the profile acquisition unit 110 may generate the battery profile BP and the differential profile DP based on the battery information.

In another example, the profile acquisition unit 110 may receive the battery profile BP from the measurement unit 12. Then, the profile acquisition unit 110 may generate the differential profile DP based on the battery profile BP.

In yet another example, the profile acquisition unit 110 may receive the differential profile DP from the measurement unit 12.

An external device may be connected to the positive electrode terminal P+ and the negative electrode terminal P− of the battery pack 10. For example, the external device may be a charging device or a load. The positive electrode terminal of the battery 11, the positive electrode terminal P+ of the battery pack 10, the external device, the negative electrode terminal P− of the battery pack 10, and the negative electrode terminal of the battery 11 may be electrically connected to each other.

Figure 9:
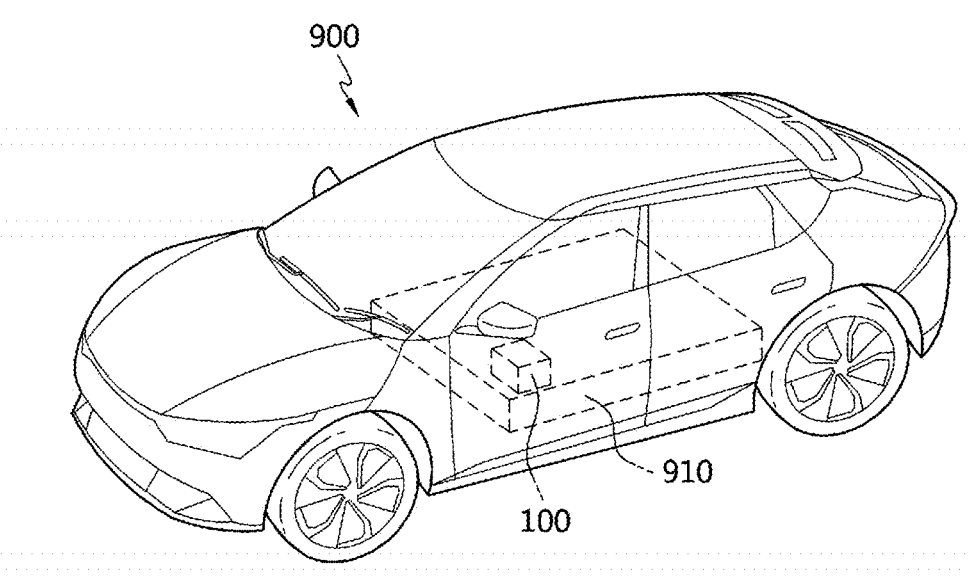
FIG. 9 is a view schematically illustrating a vehicle according to yet another embodiment of the present disclosure.

FIG. 9 is a view schematically illustrating a vehicle 900 according to yet another embodiment of the present disclosure.

Referring to FIG. 9, the battery pack according to an embodiment of the present disclosure may be included in the vehicle 900 such as an electric vehicle (EV) or a hybrid vehicle (HV). A battery pack 910 may supply a power to a motor via an inverter provided in the vehicle 900, to drive the vehicle 900. Here, the battery pack 910 may include the battery diagnosing apparatus 100. For example, the vehicle 900 may include the battery diagnosing apparatus 100. In this case, the battery diagnosing apparatus 100 may be an on-board apparatus included in the vehicle 900.

Figure 10:
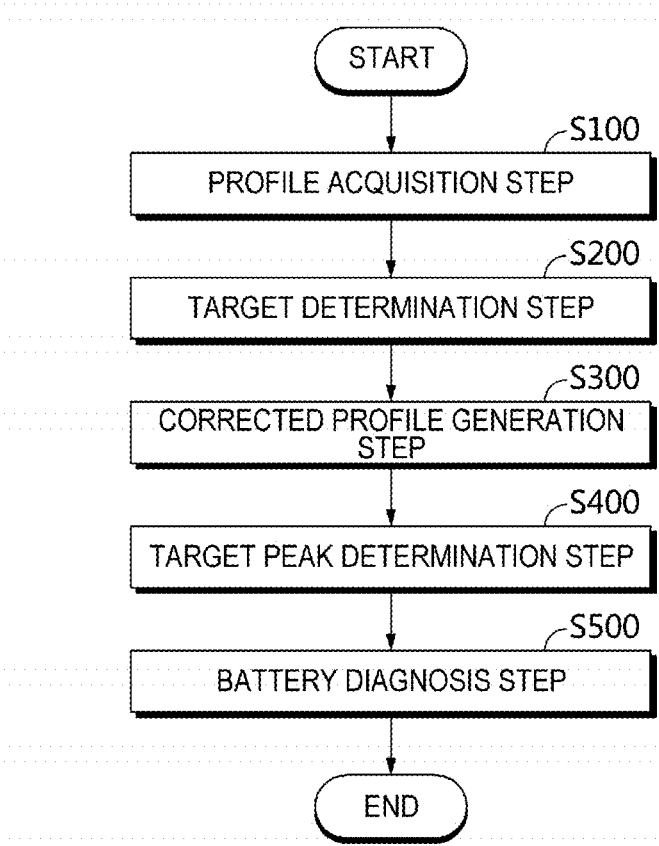
FIG. 10 is a view schematically illustrating a battery diagnosing method according to still yet another embodiment of the present disclosure.

FIG. 10 is a view schematically illustrating a battery managing method according to still yet another embodiment of the present disclosure.

Referring to FIG. 10, the battery managing method may include a profile acquisition step S100, a target determination step S200, a corrected profile (CP) generation step S300, a target peak determination step S400, and a battery diagnosis step S500.

Each step of the battery diagnosing method may be performed by the battery diagnosing apparatus 100.

The profile acquisition step S100 is a step of acquiring the differential profile DP representing the correspondence between the capacity and the differential voltage of the battery, and may be performed by the profile acquisition unit 110.

For example, the profile acquisition unit 110 may directly receive the differential profile DP of the battery from the outside. For example, the profile acquisition unit 110 may acquire the differential profile DP by being connected to the outside via a wired and/or wireless network to receive the differential profile DP.

In another example, the profile acquisition unit 110 may directly receive the battery profile BP from the outside. Then, the profile acquisition unit 110 may generate the differential profile DP based on the received battery profile BP. The profile acquisition unit 110 may be connected to the outside via a wired and/or wireless network to receive the battery profile BP, and directly generate the differential profile DP from the received battery profile BP, to acquire the differential profile DP.

In yet another example, the profile acquisition unit 110 may receive the battery information about the voltage and the capacity of the battery. Then, the profile acquisition unit 110 may generate the battery profile BP based on the received battery information, and may generate the differential profile DP based on the generated battery profile BP. The profile acquisition unit 110 may directly generate the differential profile DP based on the received battery information, to acquire the differential profile DP.

The target determination step S200 is a step of determining the target C-rate corresponding to the differential profile DP, and may be performed by the profile correction unit 120.

For example, the profile correction unit 120 may receive the differential profile DP and information about the C-rate from the profile acquisition unit 110. Then, the profile correction unit 120 may determine the C-rate corresponding to the differential profile DP to be the target C-rate.

The corrected profile (CP) generation step S300 is a step of correcting the differential profile DP based on an overvoltage profile corresponding to the target C-rate, to generate the corrected profile CP.

Then, the profile correction unit 120 may be configured to select an overvoltage profile corresponding to the target C-rate from a plurality of pre-stored overvoltage profiles. The profile correction unit 120 may be configured to calculate the difference between the differential profile DP and the overvoltage profile to generate the corrected profile CP.

For example, the profile correction unit 120 may calculate a differential capacity difference for each voltage between the differential profile DP and the overvoltage profile to generate the corrected profile CP.

The target peak determination step S400 is a step of determining the first target peak tp1 and the second target peak tp2 in the corrected profile CP, and may be performed by the control unit 130.

For example, the control unit 130 may be configured to determine, as the first target peak tp1, a minimum point with the lowest corresponding voltage in the voltage range including the medium and higher voltages of the battery among minimum points included in the corrected profile CP. Then, the control unit 130 may be configured to determine, as the second target peak tp2, a maximum point with the highest corresponding voltage among maximum points included in the corrected profile CP.

The battery diagnosis step S500 is a step of diagnosing the state of the battery based on the behavior of the first target peak tp1 and the behavior of the second target peak tp2, and may be performed by the control unit 130.

For example, the control unit 130 may determine whether the voltage corresponding to the first target peak tp1 increases as the cycle progresses. Further, the control unit 130 may determine whether the differential capacity corresponding to the second target peak tp2 decreases as the cycle progresses. The control unit 130 may be configured to diagnose that the state of the battery is the positive electrode capacity loss state, when the voltage of the first target peak tp1 increases and the differential capacity of the second target peak tp2 decreases as the cycle progresses.

The embodiments of the present disclosure described above are not only implemented by an apparatus and method, but may also be implemented by programs implementing functions corresponding to the components of the embodiments of the present disclosure or a recording medium that stores the programs. This implementation may readily be achieved by one skilled in the art to which the present disclosure belongs, from the descriptions of the embodiments above.

While the present disclosure has been described using limited embodiments and drawings, the present disclosure is not limited thereto, and it may be appreciated that various modifications and changes may be made by those having ordinary skill in the art of the present disclosure within the technical idea of the present disclosure and the equitable scope of the claims set forth below.

Further, since various substitutions, modifications, and changes may be made by those having ordinary skill in the art of the present disclosure within the scope that does not depart from the technical idea of the present disclosure, the present disclosure described above is not limited by the foregoing embodiments and the accompanying drawings, but all or portions of the embodiments may be selectively combined to implement various modifications.

DESCRIPTION OF SYMBOLS

10: battery pack
11: battery
12: measurement unit
100: battery diagnosing apparatus
110: profile acquisition unit
120: profile correction unit
130: control unit
140: storage unit
900: vehicle
910: battery pack

What is claimed is:

1. A battery diagnosing apparatus comprising:
   a profile acquisition unit configured to acquire a differential profile representing a correspondence between a voltage and a differential capacity of a battery;
   a profile correction unit configured to determine a target C-rate corresponding to the differential profile, and correct the differential profile based on an overvoltage profile corresponding to the target C-rate, thereby generating a corrected profile; and
   a control unit configured to determine a first target peak and a second target peak in the corrected profile, and diagnose a state of the battery based on a behavior of the first target peak and a behavior of the second target peak,
   wherein the overvoltage profile is based on a reference differential profile of a reference battery for a reference C-rate and a target differential profile of the reference battery for the target C-rate.

2. The battery diagnosing apparatus according to claim 1, wherein the control unit is configured to determine, as the first target peak, a minimum point with a lowest corresponding voltage in a voltage range including medium and higher voltages of the battery among minimum points included in the corrected profile.

3. The battery diagnosing apparatus according to claim 1, wherein the control unit is configured to determine, as the second target peak, a maximum point with a highest corresponding voltage among maximum points included in the corrected profile.

4. The battery diagnosing apparatus according to claim 1, wherein the control unit is configured to diagnose that the state of the battery is a positive electrode capacity loss state, when a voltage corresponding to the first target peak increases as a charging and discharging cycle of the battery progresses, and a differential capacity corresponding to the second target peak decreases as the charging and discharging cycle of the battery progresses.

5. The battery diagnosing apparatus according to claim 1, wherein the profile correction unit is configured to calculate a difference between the differential profile and the overvoltage profile to generate the corrected profile.

6. The battery diagnosing apparatus according to claim 1, wherein the overvoltage profile is pre-stored for each of a plurality of C-rates, and
   the profile correction unit is configured to select the overvoltage profile corresponding to the target C-rate from a plurality of pre-stored overvoltage profiles.

7. The battery diagnosing apparatus according to claim 1, wherein the overvoltage profile is preset to represent a difference between the reference differential profile and the target differential profile.

8. A battery pack comprising the battery diagnosing apparatus according to claim 1.

9. A vehicle comprising the battery diagnosing apparatus according to claim 1.

10. A battery diagnosing method comprising:
    a profile acquisition step of acquiring a differential profile representing a correspondence between a voltage and a differential capacity of a battery;
    a target determination step of determining a target C-rate corresponding to the differential profile;
    a corrected profile generation step of correcting the differential profile based on an overvoltage profile corresponding to the target C-rate to generate a corrected profile; and
    a target peak determination step of determining a first target peak and a second target peak in the corrected profile; and
    a battery diagnosis step of diagnosing a state of the battery based on a behavior of the first target peak and a behavior of the second target peak,
    wherein the overvoltage profile is based on a reference differential profile of a reference battery for a reference C-rate and a target differential profile of the reference battery for the target C-rate.

11. A non-transitory computer-readable storage medium having stored therein a program for performing a battery diagnosing method, the method comprising:

a profile acquisition step of acquiring a differential profile representing a correspondence between a voltage and a differential capacity of a battery;

a target determination step of determining a target C-rate corresponding to the differential profile;

a corrected profile generation step of correcting the differential profile based on an overvoltage profile corresponding to the target C-rate to generate a corrected profile;

a target peak determination step of determining a first target peak and a second target peak in the corrected profile; and a battery diagnosis step of diagnosing a state of the battery based on a behavior of the first target peak and a behavior of the second target peak, wherein the overvoltage profile is based on a reference differential profile of a reference battery for a reference C-rate and a target differential profile of the reference battery for the target C-rate.

* * * * *